United States Patent [19]

Kawamura

[11] Patent Number: 4,771,187
[45] Date of Patent: Sep. 13, 1988

[54] BISTABLE CIRCUIT

[75] Inventor: Fumito Kawamura, Tokyo, Japan

[73] Assignee: NEC Corporation, Tokyo, Japan

[21] Appl. No.: 864,652

[22] Filed: May 19, 1986

[30] Foreign Application Priority Data

May 17, 1985 [JP] Japan .............................. 60-105515
Dec. 24, 1985 [JP] Japan .............................. 60-295102

[51] Int. Cl.$^4$ ...................... H03K 3/29; H03K 17/56; H03K 19/20; H03K 17/687
[52] U.S. Cl. .................................. 307/291; 307/445; 307/571; 307/247.1
[58] Field of Search .................. 307/247 R, 273, 291, 307/473, 571, 470; 329/204

[56] References Cited

U.S. PATENT DOCUMENTS 3,229,118  1/1966  Demmerle ...................... 307/247 R
3,603,816  9/1971  Podraza ......................... 307/247 R
3,666,968  5/1972  Krocheski et al. ................. 307/291
4,121,118 10/1978  Miyazaki ........................ 307/473
4,179,628 12/1979  Ohgishi et al. ................... 307/291

Primary Examiner—Stanley D. Miller
Assistant Examiner—B. P. Davis
Attorney, Agent, or Firm—Sughrue, Mion, Zinn, Macpeak & Seas

[57] ABSTRACT

A bistable circuit comprises a flip-flop including at least one clock input, and a plurality of data inputs at least one of which is supplied with a signal at a timing independent of clocks applied to the clock input. The flip-flop also includes first and second outputs. First and second insulated gate field effect transistors are series-connected between the first output of the flip-flop and a predetermined voltage terminal. The first transistor is connected to receive at its gate a signal indicative of the condition of a selected one of the two outputs of the flip-flop, and the second transistor is connected to receive at its gate a control signal. When the selected one of the outputs assume an intermediate voltage, the first transistor is rendered conductive. In addition, the second transistor is rendered conductive in response to the control signal. As a result, the first and second transistors become conductive so as to lock the first output of the flip-flop at a potential of the predetermined voltage terminal.

5 Claims, 3 Drawing Sheets

BISTABLE CIRCUIT

BACKGROUND OF THE INVENTION

1. Field of the Invention

The present invention relates to a bistable circuit, and more particularly to a bistable circuit capable of stably operating even if a data signal is out of time with a clock signal.

2. Description of relates art

Bistable circuits alternatively assume two stable conditions in response to two inputs. Namely, if a signal is applied to a first input, the bistable circuit is brought into a first stable condition until a signal is applied to a second input. The two stable conditions of the bistable circuits can be regarded to correspond to binary information "0" and "1", respectively. Therefore, the bistable circuits have been used in various digital circuits such as counters, shift registers, and the likes. These bistable circuits are mainly divided into two types, i.e., the asynchronous type and the synchronous type. In the asynchronous bistable circuits, the application of an input signal triggers the bistable circuit immediately. On the other hand, in the synchronous type, changes of state will occur only at selected times, i.e., when or after a clock signal is applied.

In the case of a plurality of asynchronous bistable circuits being used, uncontrolled delays are inevitable, although individually very small (typically of the order of a few nanoseconds), and these delays will introduce differential delays between signals that must travel through different numbers of logic circuits. Unwanted signal combinations may therefore appear for short periods and may be interpreted erroneously.

The synchronous bistable circuits do not suffer from such a problem, because they conform to the control signals only when the clock signal is present. Therefore, the synchronous bistable circuits are widely used in logical circuits.

However, the synchroneous bistable circuits involve another problem in which the outputs take an intermediate potential when the transistion of a data signal encounters the transition of a clock signal. If such an intermediate potential is outputted to the next bistable circuit, the state of the next circuit is not determined, which would result in malfunction of a circuit including the bistable circuits.

SUMMARY OF THE INVENTION

Accordingly, it is an object of the present invention to provide a bistable circuit capable of stably operating even if a data signal is inputted in asynchronism with a clock signal.

Another object of the present invention is to provide a bistable circuit which can output a logically clearly distinguishable voltage signal so that a circuit connected to the bistable circuit will not malfunction even if the transistion of an input signal to the bistable circuit encounters the transition of a clock signal applied to the same bistable circuit.

The above and other objects of the present invention will be achieved in accordance with the present invention by a bistable circuit comprising a flip-flop including at least two signal inputs, a clock input and first and second outputs, and a lock circuit connected between the first output of the flip-flop and a predetermined supply voltage. This lock circuit has a first control input receiving a signal indicative of the condition of a predetermined one of the first and second outputs of the flip-flop and a second control input receiving a control input, so that the lock circuit is put in conductive or nonconductive condition in accordance with the condition of the predetermined output of the flip-flop in response to the control input, whereby the first output of the flip-flop is locked at one of alternatively selected logical voltage levels.

Specifically, the lock circuit includes first and second insulated gate field effect transistors series-connected between the first output of the flip-flop and the predetermined supply voltage. The first transistor has a gate connected to receive the signal indicative of the condition of the second output of the flip-flop, and the second transistor has a gate connected to receive the control signal.

If a data signal is applied to the flip-flop in asynchronism with a clock signal, more specifically if the transition of the inputted data signal encounters the transition of the applied clock signal, the first and second outputs of the flip-flop will assume intermediate voltage conditions, respectively. With the arrangement mentioned above, however, the intermediate voltage in the predetermined one of the two outputs is applied to the first control input of the lock circuit, and then, in response to the control signal applied to the second control input, the lock circuit is rendered conductive so as to short-circuit the first output of the flip-flop to the predetermined supply voltage. As a result, the first output of the flip-flop is brought into the predetermined supply voltage. Namely, the flip-flop is forcedly caused to assume one stable condition. Therefore, the next circuit connected to the output of the flip-flop will receive the output of a logically clearly distinguishable voltage, and so, can stably operate without malfunction.

In one embodiments, the gate of the first transistor is directly connected to the second output of the flip-flop. Further, the predetermined supply voltage is a source supply voltage, and the first and second transistors are n-channel transistors, respectively. In a cascade of bistable circuits, the first and second outputs of the flip-flop are respectively connected to a pair of inputs of a second flip-flop having a clock input, and the gate of the second transistor are connected to the clock input of the second flip-flop.

In another embodiments, the predetermined supply voltage is a drain supply voltage and the first and second transistors are p-channel transistors, respectively. Further, the gate of the second transistor is directly connected to the clock input of the flip-flop itself.

In a third embodiment, the lock circuit further includes a third insulated gate field effect transistor having a gate connected to the second output of the flip-flop and a source connected to the predetermined supply voltage, a fourth insulated gate field effect transistor having a gate connected to the first output of the flip-flop and a drain connected to a second supply voltage, and an inverter having an input connected to the drain of the third transistor and the source of the fourth transistor. The output of the inverter is connected to the gate of the first transistor. More specifically, the first predetermined supply voltage is a source supply voltage and the second supply voltage is a drain supply voltage. Further, the first to fourth transistors are n-channel transistors, respectively.

The above and other objects, features and advantages of the present invention will be apparent from the following description of preferred embodiments of the invention with reference to the accompanying drawings.

DESCRIPTION OF THE PREFERRED EMBODIMENTS

Figure 1:
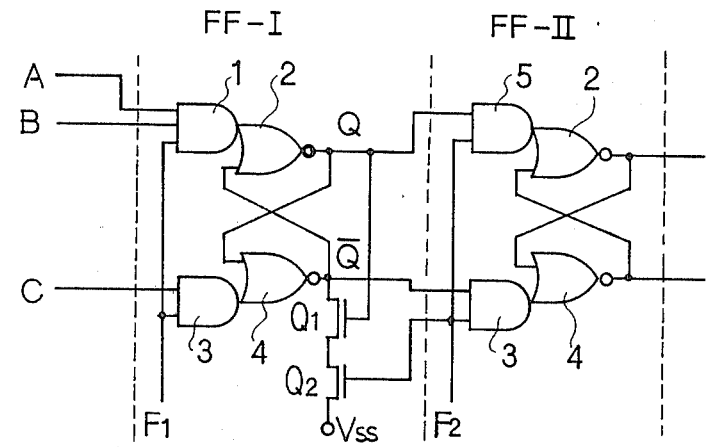
FIG. 1 is a circuit diagram of a first embodiment of a bistable circuit in accordance with the present invention.

Referring to FIG. 1, there is shown a bistable circuit embodying the present invention. The shown bistable circuit comprises a flip-flop FF-I which includes a three-input AND circuit 1 having an output connected to one input of a NOR circuit 2. The flip-flop FF-I also includes a two-input AND circuit 3 whose output is connected to one input of another NOR circuit 4. This second NOR circuit 4 has another input connected to the output of the first NOR circuit 2, and an output connected to a second input of the first NOR circuit 2. With the above arrangement, two inputs of the three-input AND circuit 1 and one input of the two-input AND circuit 3 constitute data inputs A, B and C, respectively, and the remaining inputs of the AND circuits 1 and 3 are commonly connected to form a clock input $F_1$. The input A is adapted to receive a signal in asynchronism with the clock signal $F_1$, and the inputs B and C are adapted to receive either the same signal of logical level "0" or a pair of signals in reverse to each other, i.e., the signals "0" and "1" or the signals "1" or "0", respectively.

The outputs of the two NOR circuits 2 and 4 constitute two outputs Q and $\overline{Q}$ of the flip-flop which assume voltage conditions in reverse to each other. The outputs of this flip-flop are connected to corresponding inputs of another flip-flop FF-II which has the same construction as that of the first flip-flop FF-I except that a two-input AND circuit 5 is used in place of the three-input AND circuit 1, and which also includes a clock input $F_2$ applied with a clock at a timing different from the clock $F_1$.

The flip-flops mentioned above are well-known in the art. In accordance with the present invention, furthermore, a n-channel insulated gate field effect transistor $Q_1$ is connected at its drain to the output $\overline{Q}$ of the NOR circuit 4 and at its gate to the output of the NOR circuit 2. A source of the transistor $Q_1$ is connected to a source supply voltage $V_{ss}$ through another n-channel insulated gate field effect transistor $Q_2$ whose gate is connected to the clock input $F_2$ of the next flip-flop FF-I.

In the cascade of flip-flops as explained above, assume now that as shown in FIG. 2 the inputs B and C are a high voltage and a low voltage, respectively, and the signal applied to the input A varies in asynchronism with the clock input $F_1$. As shown in the left half of FIG. 2, when the data signal A rises up, if the clock pulse $F_1$ falls down, the outputs Q and $\overline{Q}$ of the flip-flop FF-I do not perfectly change their voltage conditions and consequentially remain at intermediate voltages, respectively. But, with the intermediate voltage being applied to the gate of the transistor $Q_1$, the transistor $Q_1$ is put in a conductive condition. Therefore, when a clock pulse $F_2$ is applied to the gate of the transistor $Q_2$, the transistor $Q_2$ is turned on, so that the output $\overline{Q}$ of the flip-flop FF-I is forcedly pulled down to the voltage $V_{ss}$, i.e., the low level voltage. Therefore, the output Q of the flip-flop FF-I is forcedly pulled up to the high level voltage. Thus, when the clock input $F_2$ is applied, the flip-flop FF-I outputs a pair of voltages clearly distinguishable between the low level voltage and the high level voltage. On the other hand, since the flip-flop FF-II is triggered at the clock pulse $F_2$, the flip-flop FF-II operates without malfunction.

Figure 2:
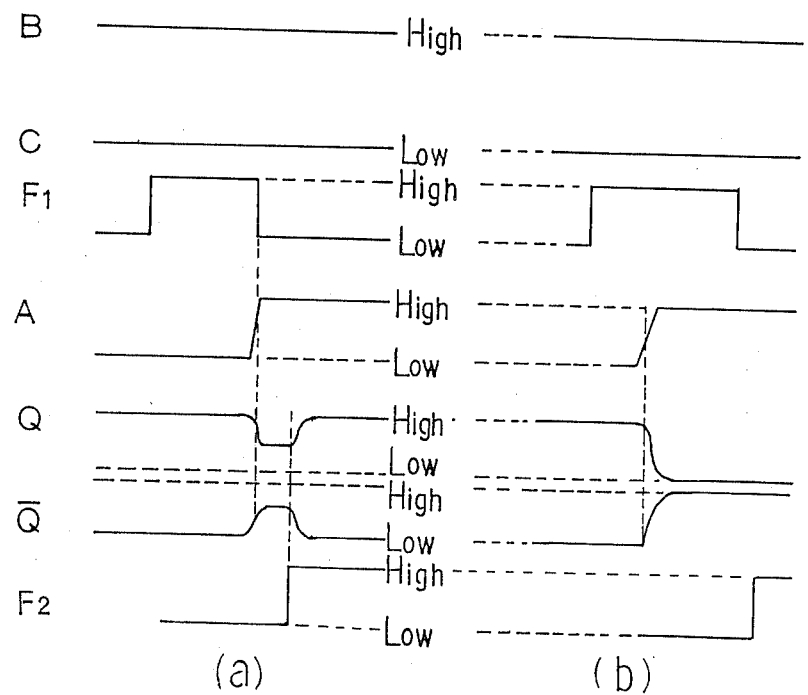
FIG. 2 is a waveform diagram showing the voltage conditions at various points in the circuit shown in FIG. 1.

As shown in the right half of FIG. 2, if the signal A changes its condition during a period of a high level of the clock pulse $F_1$, the two outputs Q and $\overline{Q}$ of the flip-flop FF-I changes their conditions perfectly. At this time, since the transistor $Q_2$ is maintained in an off condition, the flip-flop FF-I does not suffer any influence from the transistors $Q_1$ and $Q_2$.

Figure 3:
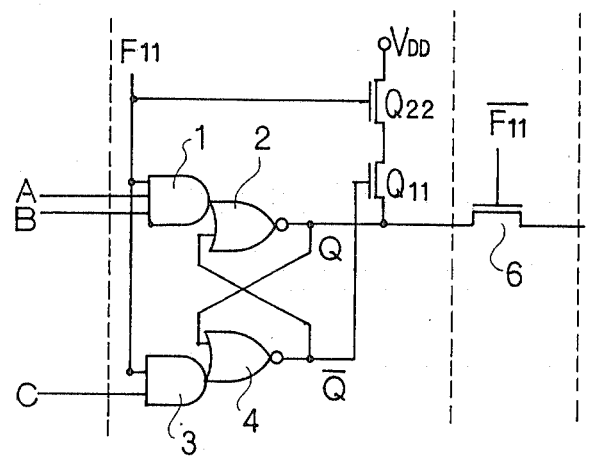
FIG. 3 is a diagram similar to FIG. 1 but showing a second embodiment of the bistable circuit.

Turning to FIG. 3, there is shown a second embodiment of the bistable circuit in which the elements similar to those shown in FIG. 1 are given the same reference numerals. In the circuit shown in FIG. 3, the output Q of a flip-flop FF-IA is connected to a transfer gate 6 and a source of a p-channel insulated gate field effect transistor $Q_{11}$ whose gate is connected to the output Q of the flip-flop FF-IA. Further, the drain of the transistor $Q_{11}$ is connected to a drain source voltage $V_{DD}$ through another p-channel insulated gate field effect transistor $Q_{22}$ whose gate is connected to the clock input $F_{11}$ of the flip-flop FF-IA.

Figure 4:
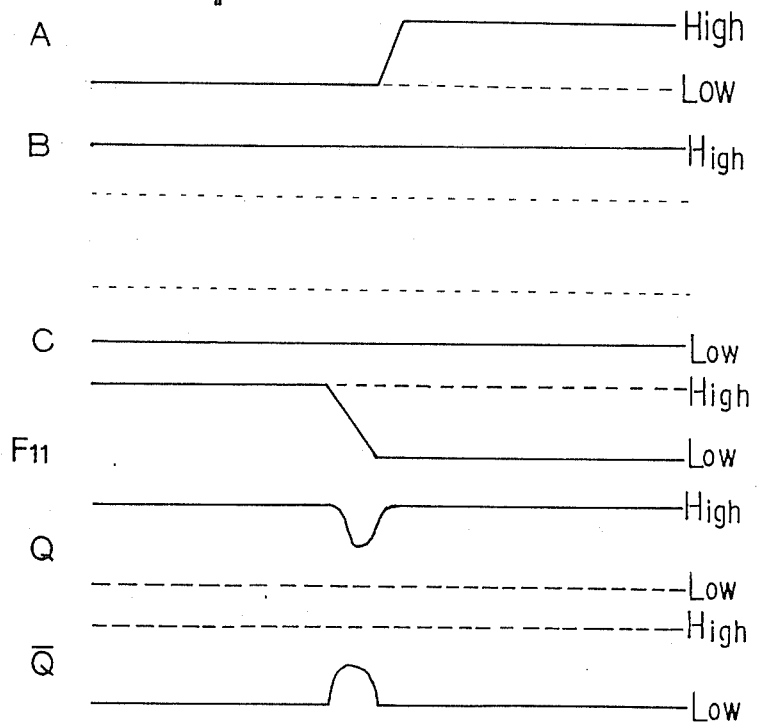
FIG. 4 is a diagram similar to FIG. 2 but showing the waveforms in the second embodiment shown in FIG. 3.

The circuit shown in FIG. 3 operates as follows. As shown in FIG. 4, under the condition that the input B is kept at a high level and the input C is a low level, when the clock pulse pulse $F_{11}$ falls down from a high level to a low level, if the input A rises up from a low level to a high level, the outputs Q and $\overline{Q}$ are brought into intermediate potentials, respectively, as seen from FIG. 4. In this condition, the transistor $Q_{11}$ is brought into a conductive condition. Then, when the control signal $F_{11}$ becomes a low level, the transistor $Q_{22}$ is rendered conductive, with the result that the output Q of the flip-flop is pulled up to the voltage $V_{DD}$.

In the circuit as shown in FIG. 3, if the transition of the input A is separated from the transition of the control signal $F_{11}$, the flip-flop FF-IA will operate in a similar manner to conventional ones, and do not suffer any adverse effect from the transistors $Q_{11}$ and $Q_{22}$ because either the transistor $Q_{11}$ or $Q_{22}$ is put in an off condition.

Figure 5:
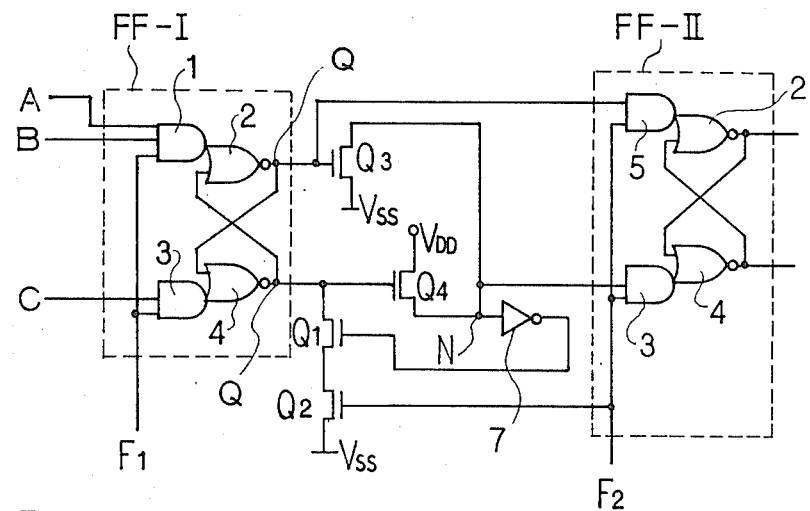
FIG. 5 is a diagram similar to FIG. 1 but showing a third embodiment of the bistable circuit.

Referring to FIG. 5, there is shown a third embodiment of the bistable circuit in accordance with the present invention, in which the elements similar to those shown in FIG. 1 are given the same reference numerals and explanation thereon will be omitted.

The following is the points differing from the first embodiment shown in FIG. 1. The output Q of the NOR circuit 2 is connected to a gate of a third n-channel insulated gate field effect transistor $Q_3$ whose source is connected to a source supply voltage $V_{ss}$. On the other hand, the output $\overline{Q}$ of the NOR circuit 4 is connected to a gate of a fourth n-channel insulated gate field effect transistor $Q_4$ whose drain is connected to a drain supply voltage $V_{DD}$. A source of the transistor $Q_4$ is connected at a node N to a drain of the transistor $Q_3$ and an input of an inverter 7 whose output is connected to the gate of the transistor $Q_1$. With the above arrangement, the output Q of the NOR circuit 2 and the node N (the source of the transistor $Q_4$) constitute a pair of output of the flip-flop which should be connected to the next flip-flop FF-II.

Figure 6:
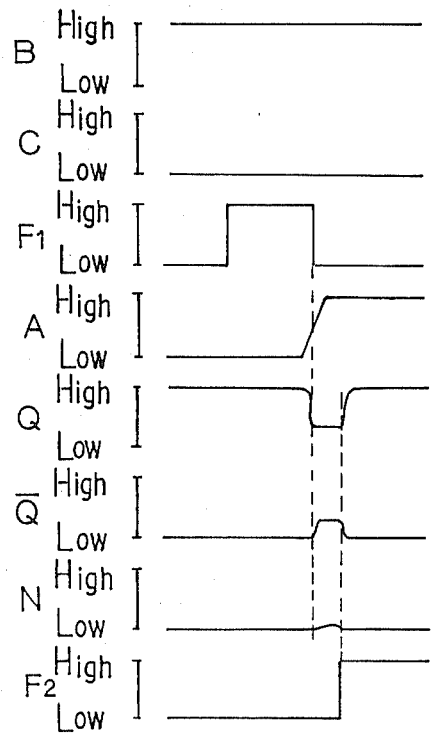
FIG. 6 is a diagram similar to FIG. 2 but showing the waveforms in the third embodiment shown in FIG. 5.

In the circuit as shown in FIG. 5, when the inputs B and C are a high level and a low level, respectively and when the clock signal $F_1$ falls down, if the input A rises up to a high level, the outputs Q and $\overline{Q}$ of the flip-flop FF-I take intermediate voltages, respectively, as seen from FIG. 6. In this condition, the transistors $Q_3$ and $Q_4$ are turned on, so that the transistor $Q_4$ acts as a level shifter. As a result, as shown in FIG. 6, the node N connected to the drain of the transistor $Q_3$ and the source of the transistor $Q_4$ will take a voltage lower than that of the output Q. Thus, the low voltage is inverted by the inverter 7 and a high voltage is applied to the gate of the transistor $Q_1$ so as to turn the transistor $Q_1$ on. On the other hand, when the clock pulse $F_2$ is applied to, the transistor $Q_2$ is turned on. Accordingly, the output Q is pulled down to the voltage $V_{ss}$ i.e., the low voltage. In the above mentioned circuit, the inputs of the next flip-flop FF-II are connected to the output Q of the flip-flop FF-I and the node N. Therefore, since the input of the flip-flop FF-II is isolated from the output $\overline{Q}$ of the flip-flop FF-I by means of the transistor $Q_4$, the flip-flop FF-II is not influenced by the operation of the transistors $Q_1$ and $Q_2$.

The above three embodiments are adapted such that when the flip-flop takes intermediate voltage outputs, the two outputs of the flip-flop are forcedly returned to the condition just before the change. However, it is possible to construct the bistable circuit so that when the flip-flop assumes intermediate output voltages, the change of the outputs is further progressed, whereby the outputs take the conditions in reverse to the conditions just before the change occurs. Furthermore, in the shown embodiment, the output of the flip-flop is connected to another flip-flop. However, the output of the flip-flop can be connected to latch circuits, inverters, and other digital circuits.

The present invention has thus been shown and described with reference to specific embodiments. However, it should be noted that the invention is in no way limited to the details of the illustrated structures but changes and modifications may be made within the scope of the appended claims.

I claim:

1. A bistable circuit comprising a flip-flop including at least two signal inputs, a clock input and first and second outputs, and a lock circuit connected between the first output of the flip-flop and a predetermined supply voltage, the lock circuit having a first control input receiving a signal indicative of the condition of a predetermined one of the first and second outputs of the flip-flop and a second control input receiving a control input, so that the lock circuit is put in conductive or nonconductive condition in accordance with the condition of the predetermined output of the flip-flop in response to the control input, whereby the first output of the flip-flop is locked at one of alternatively selected logical voltage levels;

wherein the lock circuit includes first and second insulated gate field effect transistors series-connected between the first output of the flip-flop and the predetermined supply voltage, the first transistor having a gate connected to receive the signal indicative of the condition of the second output of the flip-flop, and the second transistor having a gate connected to receive the control signal, a third insulated gate field effect transistor having a gate connected to the second output of the flip-flop and a source connected to the predetermined supply voltage, a fourth insulated gate field effect transistor having a gate connected to the first output of the flip-flop and a drain connected to a second supply voltage, and an inverter having an input connected to the drain of the third transistor and the source of the fourth transistor, the output of the inverter being connected to the gate of the first transistor.

2. A bistable circuit claimed in claim 1 wherein the first supply voltage is a source supply voltage and the second supply voltage is a drain supply voltage, and wherein the first to fourth transistors are n-channel transistors, respectively.

3. A bistable circuit claimed in claim 2 wherein the first and second outputs of the flip-flop are respectively connected to a pair of inputs of a second flip-flop having a clock input, the gate of the second transistor being connected to the clock input of the second flip-flop.

4. A bistable circuit comprising a flip-flop including at least one clock input, and a plurality of data inputs at least one of which is supplied with a signal at a timing independent of a clock signal applied to the clock input, the flip-flop also having first and second outputs, first and second insulated gate field effect transistors series-connected between the first output of the fli-flop and a predetermined voltage terminal, the first transistor having a gate connected to receive a signal indicative of the condition of a selected one of the two outputs of the flip-flop, and the second transistor having a gate connected to receive a control signal, a third insulated gate field effect transistor having a gate connected to the second output of the flip-flop and a source connected to the predetermined voltage terminal, a fourth insulated gate field effect transistor having a gate connected to the first output of the flip-flop and a drain connected to a second voltage terminal, and an inverter having an input connected to the drain of the third transistor and the source of the fourth transistor, the output of the inverter being connected to the gate of the first transistor.

5. A bistable circuit which includes a first flip-flop having at least one clock input, a pair of outputs and a plurality of data inputs at least one of which is supplied with a signal at a timing independent of a clock signal applied to the clock input, a second flip-flop having one clock input, a pair of inputs connected to the corresponding outputs of the first flip-flop, and a pair of outputs, wherein the improvement comprises a circuit connected to the outputs of the first flip-flop and so adapted that when a signal applied to the above mentioned one input of the first flip-flop transiently varies in the course of the rising-up of the clock signal applied to the first flip-flop, the circuit forcedly returns the output conditions of the first flip-flop to the conditions just before the transition of the above mentioned one input of the first flip-flop.

said circuit including first and second insulated gate field effect transistors series-connected between the first output of the first flip-flop and a predetermined voltage terminal, the first transistor having a gate connected to receive a signal indicative of the condition of a selected one of the two outputs of the first flip-flop, and the second transistor having a gate connected to receive a clock signal applied to the clock input of the second flip-flop, a third insulated gate field effect transistor having a gate connected to the second output of the first flip-flop and a source connected to the predetermined voltage terminal, a fourth insulated gate field effect transistor having a gate connected to the first output of the first flip-flop and a drain connected to a second voltage terminal, and an inverter having an input connected to the drain of the third transistor and the source of the fourth transistor, the output of the inverter being connected to the gate of the first transistor.

* * * * *

UNITED STATES PATENT AND TRADEMARK OFFICE
CERTIFICATE OF CORRECTION

PATENT NO. : 4,771,187

DATED : September 13, 1988

INVENTOR(S) : Fumito KAWAMURA

It is certified that error appears in the above-identified patent and that said Letters Patent is hereby corrected as shown below:

COLUMN 1, LINE 10    Delete "relates" and insert --related--.

COLUMN 6, LINE 33    Delete "fli-flop" and insert --flip-flop--.

Signed and Sealed this

Thirteenth Day of June, 1989

Attest:

DONALD J. QUIGG

Attesting Officer

Commissioner of Patents and Trademarks